(12) United States Patent
Cerutti (10) Patent No.: US 8,558,617 B2
(45) Date of Patent: *Oct. 15, 2013

(54) MULTILEVEL CLASS-D AMPLIFIER

(71) Applicant: Maxim Integrated Products, Inc., San Jose, CA (US)

(72) Inventor: Cristian Cerutti, Voghera (IT)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/710,444

(22) Filed: Dec. 10, 2012

(65) Prior Publication Data

US 2013/0099859 A1 Apr. 25, 2013

Related U.S. Application Data

(63) Continuation of application No. 13/038,376, filed on Mar. 1, 2011, now Pat. No. 8,330,541.

(51) Int. Cl.
*H03F 3/217* (2006.01)
(52) U.S. Cl.
CPC .................................. *H03F 3/217* (2013.01)
USPC ..................................................... 330/207 A (58) Field of Classification Search
USPC .......................... 330/10, 207 A, 251
See application file for complete search history.

(56) References Cited

U.S. PATENT DOCUMENTS 6,535,058 B1 * 3/2003 Kim ................................ 330/10
8,330,541 B2 * 12/2012 Cerutti ..................... 330/207 A

* cited by examiner

*Primary Examiner* — Steven J Mottola
(74) *Attorney, Agent, or Firm* — TIPS Group (57) ABSTRACT

A multilevel class-D differential amplifier which can be operated in at least three modes includes a first power stage and a second power stage. In an idle mode, an output of the first power stage varies between a first voltage level and a second voltage level, wherein an output of the second power stage varies between the first voltage level and the second voltage level. In a PWM mode, the output of the first power stage varies between the first voltage level and the second voltage level, wherein the output of the second power stage varies between the first voltage level and the second voltage level. In a Multi-Level mode, the output of said first power stage varies between said second voltage level and a third voltage level, wherein said output of said second power stage is fixed at said first voltage level, and wherein said differential signal between said outputs of said power stages is pulse width modulated.

20 Claims, 6 Drawing Sheets

MULTILEVEL CLASS-D AMPLIFIER

CROSS REFERENCE TO RELATED APPLICATION

This application is a continuation of U.S. patent application Ser. No. 13/038,376, filed Mar. 1, 2011, now U.S. Pat. No. 8,330,541, which is incorporated herein by reference.

BACKGROUND

A class-D amplifier generates a square wave of which the duty cycle is modulated to reproduce an audio signal applied to its input. Since the output is binary, the dissipation is generally much lower than that of a traditional linear amplifier. Also, since the low-frequency portion of the spectrum of the output signal of a class-D amplifier is essentially the wanted audio signal, and the high-frequency portion serves no purpose other than to make the waveform binary, the high-frequency portion of the output signal is typically removed with a passive low-pass filter made essentially with reactive components (e.g. an L-C filter) to maintain high efficiency. However, depending on the modulation scheme, a class-D amplifier can be "filter-less," e.g. it would not require any filtering other than the intrinsic L-R filter of the load (e.g. a dynamic loudspeaker).

The filter-less operation is mostly evident during an idle state, when the input signal is very low or even zero. In that case, a "non-filter-less" amplifier, providing a high frequency signal to the load, will dissipate energy if the filter is not properly designed or operated. This does not happen with a filter-less amplifier where, for zero or small signal, only a small amount of high frequency energy is applied to the loudspeaker.

Many parameters contribute to the total power dissipation of a class-D amplifier. The ohmic conduction (aka "IR") losses are usually the largest although commutation losses are also important. Commutation losses include the power used to drive the output transistors and the power that is used to make a transition at the output (e.g. current to charge and discharge the output parasitic capacitor).

A drawback of any switching amplifier is radio frequency (RF) emission. Since the binary transition is sharp, the output spectrum has a significant content in the radio-frequency range. The wires that connect the amplifier to the loudspeaker act as radiating antennas and can interfere with RF-sensitive equipment nearby. The RF emission depends on the slope of the binary signal, as well as on its amplitude. Since it is mandatory to be compliant with international standards and directives, if no other design solution is applied, RF emission must be reduced at the cost of external filtering components.

The maximum power delivered to the load depends on the amplitude of the binary signal which is typically equal to the supply voltage. To get more power from a certain supply, boost technique can be used, e.g. a Class-D amplifier supplied by a boosted voltage. In that case RF emission is higher because of the larger amplitude of the binary waveform and efficiency is lower due to the losses into the supplying DCDC converter.

A patent describing a class-D amplifier is U.S. Pat. No. 6,535,058 of Kim entitled "Multi-Reference, High Accuracy Switching Amplifier." Kim does not, by way of non-limiting examples, address the issues of filter-less idle operation, amplifier efficiency or RF emission characteristics of his amplifier.

These and other limitations of the prior art will become apparent to those of skill in the art upon a reading of the following descriptions and a study of the several figures of the drawing.

SUMMARY

In an embodiment, set forth by way of example and not limitation, a multilevel class-D amplifier includes a first power stage and a second power stage. The first power stage has a first input, a second input, an output and at least three power inputs. The first power stage also includes logic such that when the first input is at a first logic level the output is at a first voltage level, when the first input is at a second logic level and the second input is at the first logic level the output is at a second voltage level, and when both the first input and the second input are at the second logic level the output is at a third voltage level. The second power stage has a first input, a second input, an output and at least three power inputs. The second power stage includes logic such that when the first input is at a first logic level the output is at a first voltage level, when the first input is at a second logic level and the second input is at the first logic level the output is at a second voltage level, and when both the first input and the second input are at the second logic level the output is at a third voltage level.

In an embodiment, set forth by way of example and not limitation, an amplifier includes a first power stage including a first input, a second input, an output and three power inputs, a first comparator including a signal input, a triangle wave input and an output coupled to the first input of the first power stage, and a second comparator having a signal input, a triangle wave input and an output coupled to the second input of the first power stage, wherein the signal input of the second comparator is coupled to the signal input of the first comparator. The example amplifier also includes a second power stage having a first input, a second input, an output and three power inputs, a third comparator having a signal input, a triangle wave input and an output coupled to the first input of the second power stage, wherein the triangle wave input of the third comparator is coupled to the triangle wave input of the first comparator, and a fourth comparator having a signal input, a triangle wave input and an output coupled to the second input of the second power stage, wherein the signal input of the fourth comparator is coupled to the signal input of the third comparator, and wherein the triangle wave input of the fourth comparator is coupled to the triangle wave input of the second comparator.

In an embodiment, set forth by way of example and not limitation, a method operates a multilevel class-D differential amplifier including a first power stage and a second power stage in at least three modes. In an idle mode, an output of the first power stage varies between a first voltage level and a second voltage level, wherein an output of the second power stage varies between the first voltage level and the second voltage level, and wherein a differential signal between the outputs of the power stages is about zero. In a PWM mode, the output of the first power stage varies between the first voltage level and the second voltage level, wherein the output of the second power stage varies between the first voltage level and the second voltage level, and wherein the differential signal between the outputs of the power stages is pulse width modulated. In a Multi-Level mode, the output of the first power stage varies between the second voltage level and a third voltage level, wherein the output of the second power stage is fixed at the first voltage level, and wherein the differential signal between the outputs of the power stages is pulse width modulated.

Advantages of certain example embodiments include filter-less operation, reduction of RF emissions and/or increased efficiencies for a class-D amplifier.

These and other embodiments and advantages and other features disclosed herein will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTIONS

Figure 1:
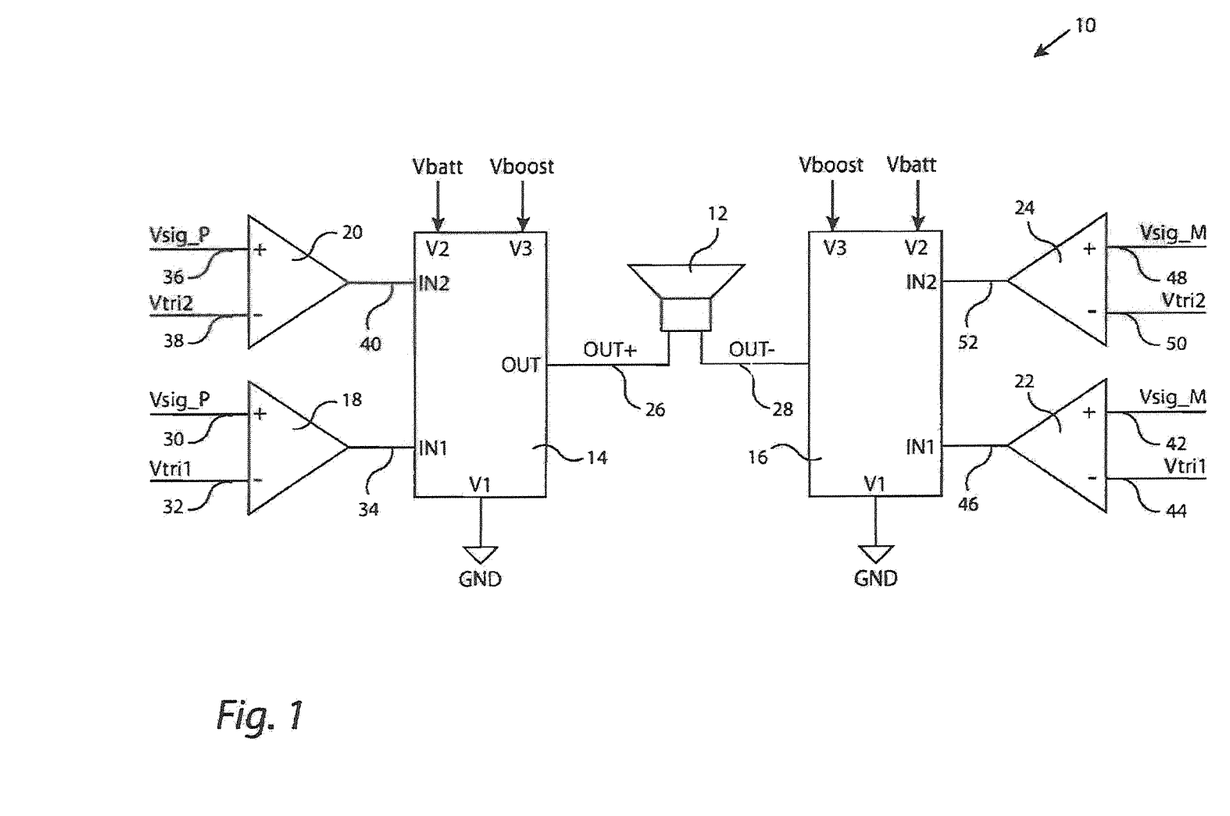
FIG. 1 is a block diagram of an example amplifier.

FIG. 1 is a block diagram, set forth by way of example but not limitation, of an amplifier 10 and a loudspeaker 12. The amplifier 10 includes a power stages 14 and 16 and comparators 18, 20, 22 and 24. In an embodiment, the amplifier 10 is a part of an integrated circuit and the loudspeaker 12 is an external load. This form of circuitry is sometimes referred to as a bridge tied load (BTL).

Power stages 14 and 16 are, in this non-limiting example, substantially the same in construction and operation. Each of power stages 14 and 16 have a first input IN1, a second input IN2, an output OUT, a ground input V1, a battery input V2 and a boost input V3. That is, both of power stages 14 and 16, in this example, are coupled to three "power rails" which facilitates the multilevel operation of the amplifier 10.

It should be noted that the power rails are not limited to ground, battery and boost as set forth in this example. For example, another reference other than ground can be used for one of the rails. Also, any of the rails can be powered by any convenient power source, such as one or more batteries, power supplies, capacitive supplies, voltage boosters, current sources, etc. By way of non-limiting example, V1 and V2 can be provided by the negative and positive terminals of a battery, and V3 can be provided by a voltage doubler powered by the battery. Alternatively, by way of another non-limiting example, two batteries can be used.

Amplifier 10 is configured, in this example, as a differential power amplifier. That is, power stage 14 is configured to provide an OUT+ signal 26 and power stage 16 is configured to provide an OUT− signal 28. The loudspeaker 12 (or other load) is powered by the differential signal which is the difference between signal 26 and signal 28.

Comparator 18 has a signal input 30, a triangle wave input 32 and an output 34. In this non-limiting example, signal input 30 is coupled to the "+" input of comparator 18 and the triangle wave input 32 is coupled to the "−" input of comparator 18. Of course, as will be appreciated by those of skill in the art, the input polarities can be reversed with appropriate modification of the circuitry of amplifier 10. The output 34 is, in this example, coupled to IN1 of power stage 14.

Comparator 20 has a signal input 36, a triangle wave input 38 and an output 40. In this non-limiting example, signal input 36 is coupled to the "+" input of comparator 20 and the triangle wave input 38 is coupled to the "−" input of comparator 20. Of course, as will be appreciated by those of skill in the art, the input polarities can be reversed with appropriate modification of the circuitry of amplifier 10. The output 40 is, in this example, coupled to IN2 of power stage 14.

Comparator 22 has a signal input 42, a triangle wave input 44 and an output 46. In this non-limiting example, signal input 42 is coupled to the "+" input of comparator 22 and the triangle wave input 44 is coupled to the "−" input of comparator 22. Of course, as will be appreciated by those of skill in the art, the input polarities can be reversed with appropriate modification of the circuitry of amplifier 10. The output 46 is, in this example, coupled to IN1 of power stage 16.

Comparator 24 has a signal input 48, a triangle wave input 50 and an output 52. In this non-limiting example, signal input 48 is coupled to the "+" input of comparator 24 and the triangle wave input 50 is coupled to the "−" input of comparator 24. Of course, as will be appreciated by those of skill in the art, the input polarities can be reversed with appropriate modification of the circuitry of amplifier 10. The output 52 is, in this example, coupled to IN2 of power stage 16.

It should be noted that, in this example, four signals are applied to the comparators 18-24. These include differential input signals Vsig_P and Vsig_M (sometimes referred to as an "audio signal") and two triangle waves Vtri1 and Vtri2. As used herein, a "triangular signal" or "triangle wave" is a non-sinusoidal waveform characterized by its triangular shape. Like a square wave, a triangle wave contains only odd harmonics.

In this example, the triangle waves have the same frequency and phase. The frequency is far above that of the audio signal being amplified. For example, the frequency of the triangle waves may be about 300 KHz, which is at least an order of magnitude greater than the audio signal to be amplified.

By applying both an audio signal and a triangle wave to the comparators binary waveforms are developed at their outputs. That is, a binary waveform is developed using pulse width modulation (PWM) by comparing the high frequency triangle waves with the audio signals to generate a series of pulses of which the duty cycle is directly proportional with the instantaneous value of the audio signal. An output filter (which may be inherently provided by, for example, loudspeaker 12) removes the high-frequency components of the PWM signal to recover the amplified audio signal.

As noted above, example amplifier 10 has 3 power rails, namely GND, Vbatt and Vboost. For example, the three rails can be at 0 volts, 5 volts d.c. and 10 volts d.c. In this example, GND is coupled to the V1 power inputs, Vbatt is coupled to the V2 power inputs and Vboost is coupled to the V3 power inputs of power stages 14 and 16. Vboost can be developed, by way of non-limiting example, using a voltage doubler circuit.

The provision, in this example, of three power inputs to the power stages 14 and 14 permits "multilevel" operation of the amplifier 10. That is, for low amplitude audio signals the amplifier 10 can operate in a lower power mode but for high amplitude audio signals the amplifier 10 can operate in a higher power mode to reduce signal distortion.

Table 1, below, illustrates three example operating states for the power stages 14 and 16. In a first state, the logical input (e.g. "0" or "LO" or "1" or "HI") to input IN1 of a power stage is "0" and the output OUT of the power stage is V1. In a second state, the logical input to input IN1 is "1," the logical input to input IN2 is "0" and the output OUT of the power stage is V2. In a third state, the logical input to input IN1 is "1," the logical input to input IN2 is "1" and the output OUT of the power stage is V3.

TABLE 1

| IN1 | IN2 | OUT |
|-----|-----|-----|
| 0   | X   | V1  |
| 1   | 0   | V2  |
| 1   | 1   | V3  |

Note:
X = doesn't care

Figure 2:
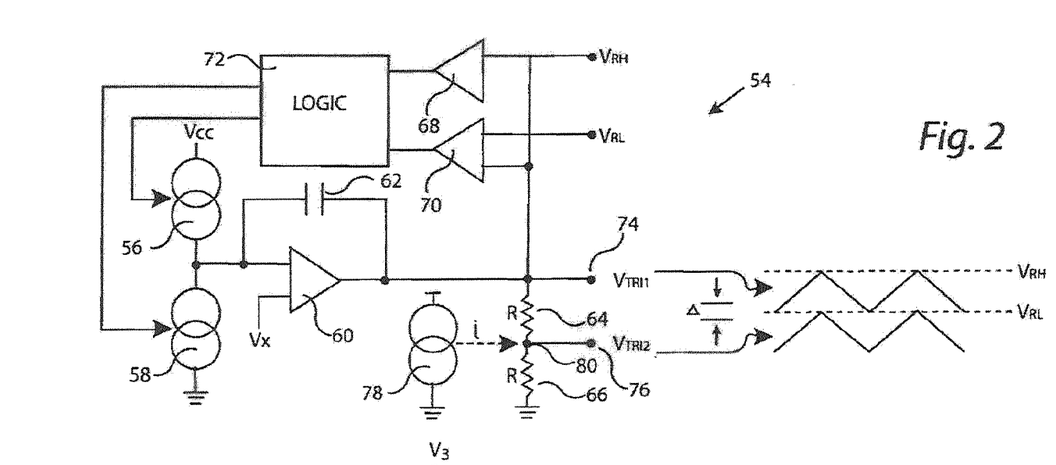
FIG. 2 is a block diagram of an example triangle wave generator which may form a part of the amplifier of FIG. 1.

FIG. 2 is a block diagram of an example triangle wave generator 54 which can be used to generate triangle waves $V_{TRI1}$ and $V_{TRI2}$. In this example, triangle wave generator 54 includes a pair of variable current sources 56 and 58, an operational amplifier 60, a feedback capacitor 62, a pair of voltage divider resistors 64 and 66, a pair of comparators 68 and 70, and control logic 72.

Current sources 56 and 58, in conjunction with operational amplifier 60 and capacitor 62, oscillate to generate the triangle wave $V_{TRI1}$ at a node 74. Resistors 64 and 66, both of which have the same value R, divide $V_{TRI1}$ by 2 to develop $V_{TRI2}$ at a node 76. That is, $V_{TRI1}$ and $V_{TRI2}$ have a common factor which, in this case, is $V_{TRI1}$. As can be seen in FIG. 2, the amplitude of $V_{TRI1}$ is twice the amplitude of $V_{TRI2}$.

The example triangle wave generator 54 provides a vertical offset between $V_{TRI1}$ and Vtri2 as seen in FIG. 2. In this example, the offset is provided by feedback of $V_{TRI1}$ via comparators 68 and 70 which are provided with reference voltages $V_{RH}$ and $V_{RL}$, respectively. Control logic 72 uses the output of comparators 68 and 70 to control current sources 56 and 58 to provide the desired vertical offset. As seen in FIG. 2, the vertical offset between $V_{TRI1}$ and $V_{TRI2}$ causes the peaks of $V_{TRI1}$ to align with $V_{RH}$, the troughs of $V_{TRI1}$ to align with $V_{RL}$, and the peaks of $V_{TRI2}$ to align with $V_{RL}$.

When the vertical offset between $V_{TRI1}$ and $V_{TRI2}$ is about zero, as shown in FIG. 2, the two triangle waveforms are considered to be "vertically adjacent." If the peaks of $V_{TRI2}$ do not align with the troughs of $V_{TRI1}$ there may be a small Δ with respect to the two. If there is Δ overlap, then the two triangular waves are considered to "vertically overlap." If there is a Δ separation, then the two triangular waves are considered to be "vertically separated."

Some degree of vertical overlap or vertical separation can be desirable to promote linear operation of the amplifier 10. The Δ between the two triangle waves can be controlled by an optional current source 78 which can inject a positive or negative current i into a node 80 between resistors 64 and 66.

It should be noted that there are other ways of generating two or more vertically offset triangle wave signals. For example, a plurality of triangle wave generators could be used. Therefore, as used herein, a "triangle wave generator" can include one or more circuits, inputs or devices used to generate multiple triangle waves.

Figure 3:
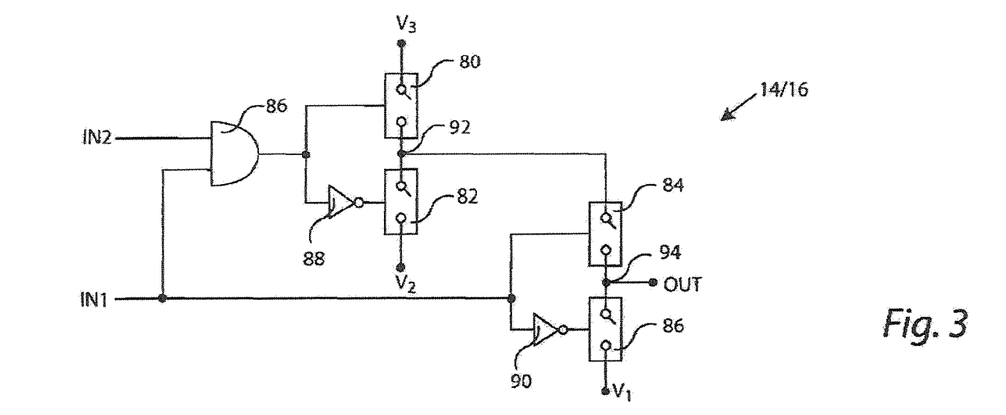
FIG. 3 is a block diagram of example logic which may form a part of the amplifier of FIG. 1.

FIG. 3 is a block diagram of example power stages 14 and 16. In this diagram, set forth by way of example but not limitation, a power stage 14/16 includes four solid state switches 80, 82, 84 and 86, an AND gate 86, and two inverters 88 and 90. Input IN1 is coupled to an input of AND gate 86 and controls switch 84 and switch 86 via inverter 90. Input IN2 is coupled to another input of AND gate 86. The output of AND gate 86 controls switch 80 and, via inverter 88, switch 82.

Switches 80 and 82 are coupled in series between V3 and V2. Switches 84 and 86 are coupled in series between a node 92 between switches 80 and 82 and V1. A node 94 develops the output signal OUT. Switches 80-86 may, by non-limiting example, comprise one or more transistors, such as MOSFET transistors. The example power stages 14/16 of FIG. 3 implement the truth table of Table 1.

Other circuitry may also be included in power stages 14 and 16. By way of non-limiting example, each power stage may include circuitry to prevent unwanted cross-conduction using Break-Before-Make or other techniques. Such other circuitry is well known to those of skill in the art.

Figure 4:
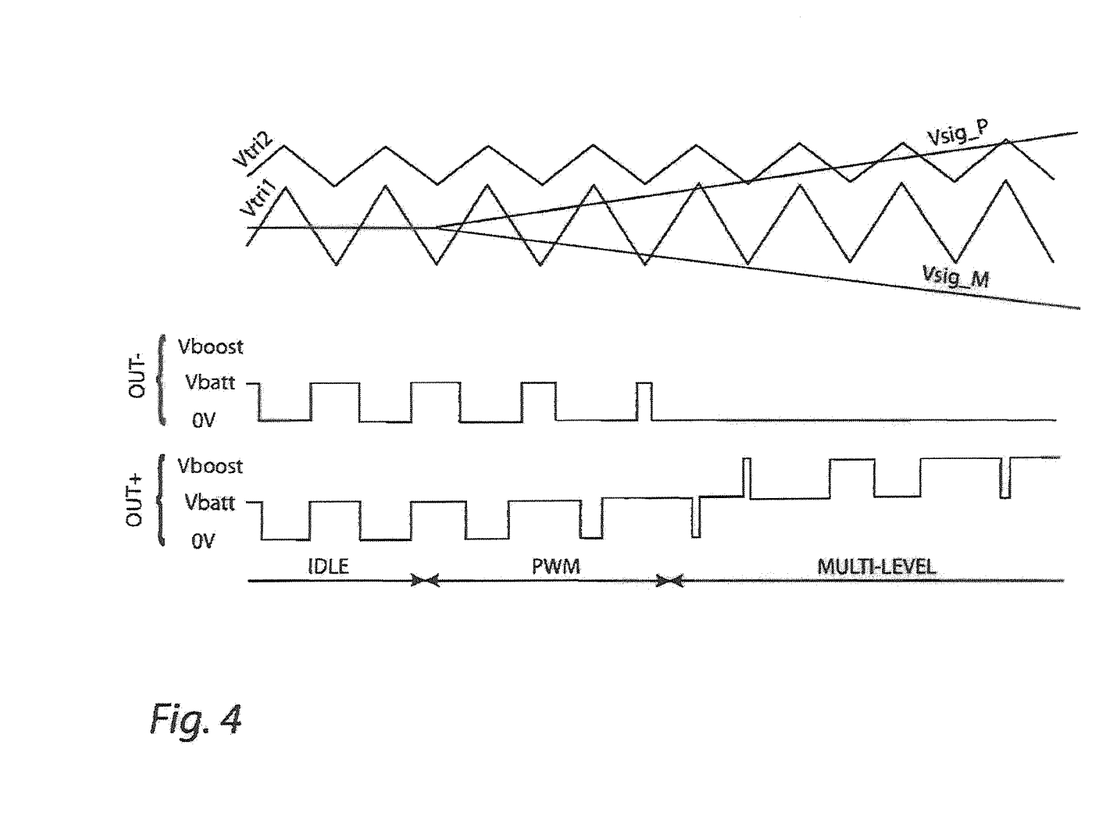
FIG. 4 is a graph illustrating example signals of the amplifier of FIG. 1.

FIG. 4 is a first example of an operation of amplifier 10 of FIG. 1. In this example, the amplifier 10 operates in three modes referred to as IDLE, PWM and Multi-Level. Near the top of the graph, the triangle waves $V_{TRI1}$ and $V_{TRI2}$ are illustrated, as are example Vsig_P and Vsig_M signals. When Vsig_P=Vsig_M the amplifier 10 is in the IDLE mode wherein the square waves generated at the power stage outputs are equal but opposite in polarity, resulting in a cancellation. As Vsig_P and Vsig_M being to diverge, the amplifier 10 enters the PWM mode wherein a series of pulse-width-modulated (PWM) square waves having an amplitude between ground and Vbatt are generated. When the divergence between Vsig_P and Vsig_M begins to exceed the amplitude of $V_{TRI1}$, the amplifier 10 enters the Multi-Level mode wherein OUT− goes to ground and OUT+ becomes a series of pulse-width-modulated square waves having an amplitude varying between Vbatt and Vboost.

In the IDLE mode, when driven with an ideal zero signal, the amplifier 10 provides square waves of the same phase with a duty cycle=50%. This is advantageous for a filter-less class-D amplifier. That is, in this example, the differential high frequency signal across the loudspeaker 12 is ideally zero during the IDLE mode. This IDLE mode operation is considered to be preferable to a mode where the amplifier 10 does not switch at idle in that it reduces cross-over distortion.

In the PWM mode the amplifier 10 reproduces the input audio signal by changing the duty-cycle of both OUT+ and OUT−. As the audio signal increases in amplitude one duty-cycle becomes greater than 50% and the other becomes less than 50% (depending upon the polarity of the signal). Advantageously, the high frequency content of the output binary signal is minimized.

The Multi-Level mode is implemented when the amplitude of the audio signal becomes sufficiently large that it will be clipped if the amplifier 10 is supplied by Vbatt alone. The use of the boosted voltage Vboost along with the modulation technique as set forth above allows the differential output of amplifier 10 comprising the "bridge" between the power stages 14 and 16 to remain linear with the input signal. That is, one side of the bridge (OUT− of power stage 16 in this example) stops switching and stays at its minimum level (e.g. ground). The other side of the bridge (OUT+ of power stage 14 in this example) continues to switching between Vbatt and Vboost.

The amplifier 10 realizes a number of efficiencies when in the Multi-Level mode. For one, commutation losses are reduced, because only one side of the bridge (power stage 14, in this example) is switching. For another, the power delivered to the load (e.g. loudspeaker 12) comes partially, for example, from a DCDC boost converter a partially from the battery. When coming from the battery alone, losses from the boost converter are reduced.

Amplifier 10 also exhibits reduced RF emissions when in the Multi-Level mode. For example, when in the Multi-Level mode one side of the bridge (e.g. power stage 16) is not switching and, therefore, is not contributing to RF emission. Also, when OUT+ is switching between two adjacent voltage supply levels (e.g. Vbatt and Vboost) the amplitude of the binary signal is minimized and thus the amount of energy in the RF range.

In amplifier 10, the gain is ideally the ratio between the amplitude of the square wave at the output (OUT+, OUT−) and the amplitude of the triangular wave. It doubles if the modulation is double sided, as in the foregoing examples.

One of the most desirable characteristic of an audio amplifier is its linearity: the gain should not change with the amplitude of the signal. To obtain gain of "k" throughout the input range, the amplitude of the two triangular waves, in an example embodiment, can be set follows:

$$Vtri1 = Vbatt/k$$

$$Vtri2 = (Vboost - Vbatt)/2k$$

By doing so the gain of amplifier 10 remains equal to k because in the first two operational modes (IDLE and PWM) the modulation is double sided (both power stages are switching) and the square wave amplitude at each output is equal to Vbatt, while, in the multi-level range, the modulation is single sided and the square wave amplitude is Vboost−Vbatt.

At the transition between PWM and Multi-Level modes, to avoid steps and holes with in the gain of amplifier 10, the triangular waves are stacked so that the peaks of the lower signal are at the same voltage level than the valleys of the upper one as described previously. Since an actual design cannot guarantee this to happen independently from process spread, temperature and mismatch, the designer can choose to have them systematically separated by a Δ (a small voltage gap between them) or systematically superimposed by a small amount Δ.

Figure 5:
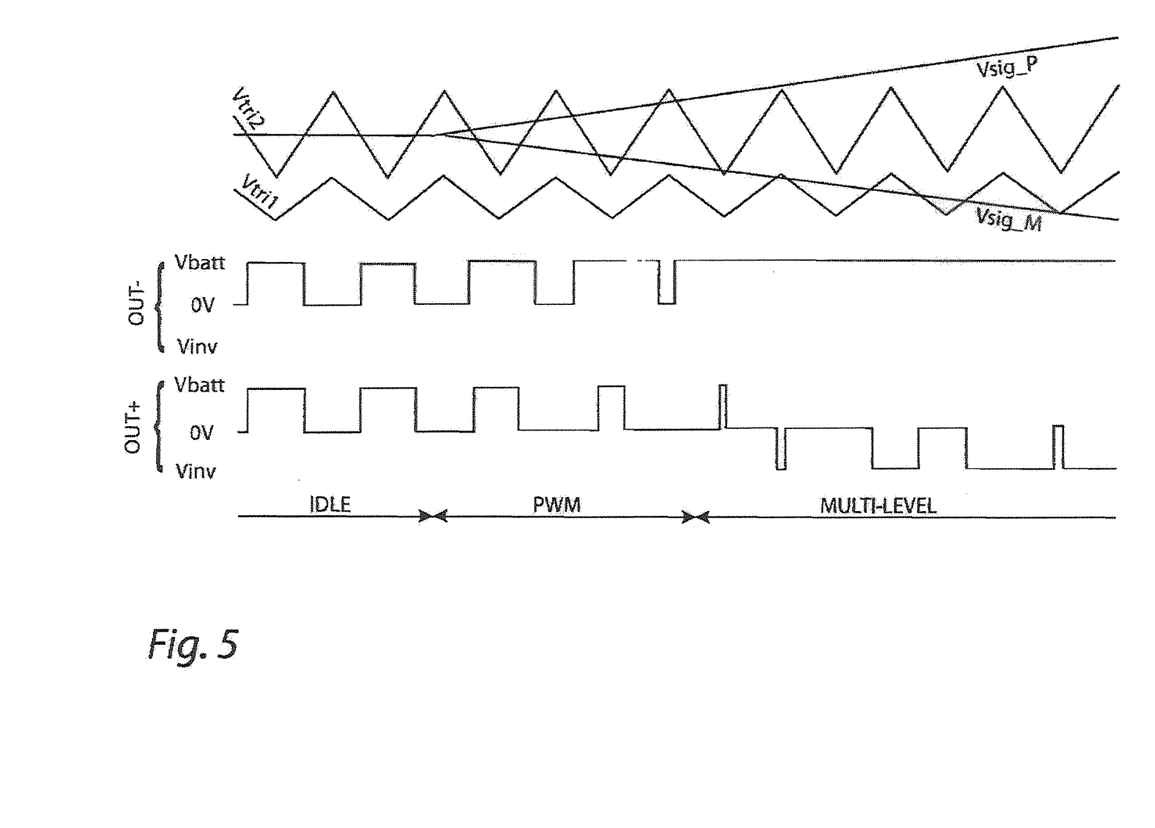
FIG. 5 is a graph illustrating alternative example signals of the amplifier of FIG. 1.

As noted above, examples have been made with certain signal polarities. Other polarities and circuit configurations can also be used. For example, a negative supply can be employed using an inverting charge pump instead of a DCDC boost converter. The amplifier 10 implementing the use of a negative supply can be similar to that described previously, except that V1=Vinv (the negative charge pump output), V2=GND (0V) and V3=Vbatt (battery voltage). The signals of this negative supply implementation are shown in FIG. 5.

Figure 6:
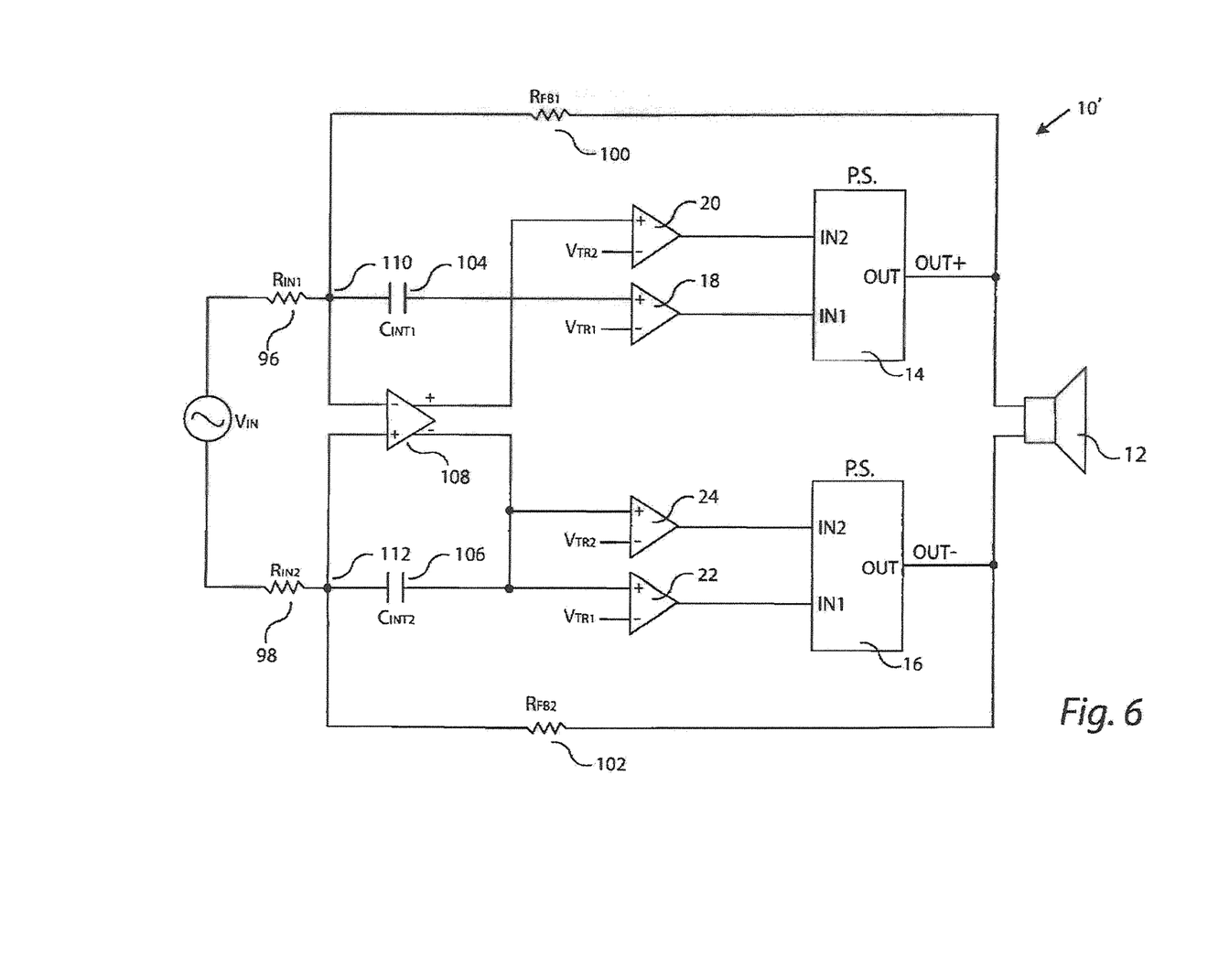
FIG. 6 is a block diagram of an alternative example amplifier with feedback.

FIG. 6 is a block diagram of an alternative example amplifier 10' with feedback. Components similar to those of amplifier 10 are given the same reference numerals and operate in a similar manner to that described above. In addition, amplifier 10' includes resistors 96, 98, 100 and 102, capacitors 104 and 106 and an inverter 108.

Feedback resistors 100 and 102 couple the OUT+ and OUT− outputs of power stages 14 and 16, respectively, to nodes 110 and 112, respectively. An audio signal $V_{IN}$ is coupled by input resistors 96 and 98, respectively, to nodes 110 and 112, respectively. The inputs of inverter 108 are coupled to nodes 110 and 112, and the outputs of inverter 108 are coupled to the signal inputs of comparators 28-24 as shown. Capacitor 104 is coupled between node 110 and the signal inputs of comparators 18 and 20 and capacitor 106 is coupled between node 112 and the signal inputs of comparators 22 and 24. The example circuitry providing negative feedback for amplifier 10' can advantageously improve the amplifier's linearity, improve the power supplies' rejection ratio, lower input impedance, etc.

From the forgoing, it is apparent that the amplifier may have many alternative configurations. For example, the amplifier may be designed as an open loop amplifier, a $1^{st}$ order integrator loop, a superior order, etc.

The foregoing examples were described in terms of three rails (e.g. 0V, 5V, 10V). Other examples may include one or more additional rails (e.g. 0V, 5V, 10V, 15V), i.e. the number of power inputs to the power stages can be P≥3. The number of triangle waves S can be related to the number of power rails P, e.g. S=P−1. As will be appreciated by those of skill in the art, additional logic circuitry will be added to accommodate the additional power inputs.

The foregoing examples were also described in term of three operating modes, namely IDLE, PWM and Multi-Level. However, there may also be additional operating modes. For example, when the input audio signal becomes too large, a "CLIPPING" mode can be entered to reduce the clipping of the output signal. By way of non-limiting example, in the CLIPPING mode one side of the bridge may be fixed to a first voltage, which the other side could be fixed to a third voltage. An example of circuit operation with both signal polarities and with a CLIPPING mode is shown in FIG. 7.

Figure 7:
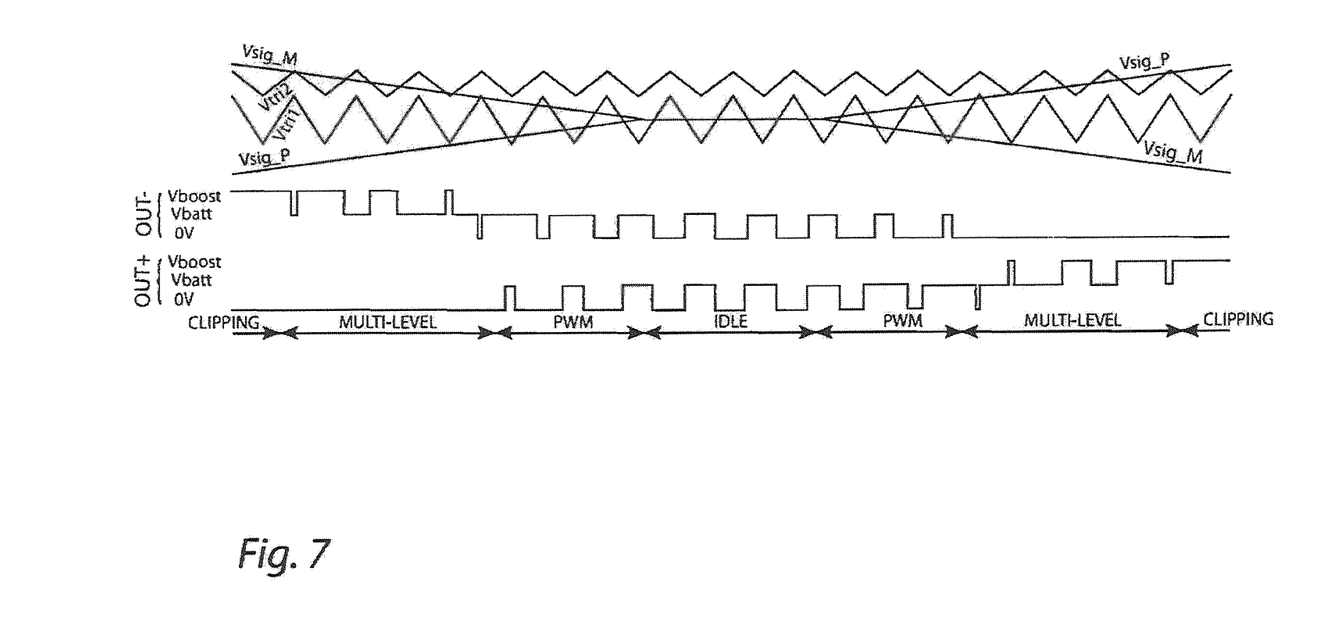
FIG. 7 is a graph illustrating alternative example signals and operating modes.

FIG. 7 illustrates various input signals and corresponding operating modes. For example, it illustrates positive signals where Vsig_P−Vsig_M>0, negative signals where Vsig_P−Vsig_M<0 and zero where Vsig_P−Vsig_M=0. It also illustrates the aforementioned optional CLIPPING mode. The graph of FIG. 7 is therefore an extension of the graph of FIG. 4. The graph of FIG. 5 can be similarly extended for positive, negative and zero signals and to show a CLIPPING mode.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A multilevel class-D amplifier comprising:
    a first power stage having a first input, a second input, an output and at least three power inputs, said first power stage including logic such that when said first input is at a first logic level said output is at a first voltage level, when said first input is at a second logic level and said second input is at said first logic level said output is at a second voltage level, and when both said first input and said second input are at said second logic level said output is at a third voltage level;
    a second power stage having a first input, a second input, an output and at least three power inputs, said second power stage including logic such that when said first input is at a first logic level said output is at a first voltage level, when said first input is at a second logic level and said second input is at said first logic level said output is at a second voltage level, and when both said first input and said second input are at said second logic level said output is at a third voltage level; and
    a generator having a first output coupled to said first inputs of said first and second power stages and a second output coupled to said second inputs of said first and second power stages, wherein said first and second outputs of said generator are non-sinusoidal waveforms that are vertically offset with respect to each other.

2. A multilevel class-D amplifier as recited in claim 1 wherein said at least three power inputs include a ground input, a battery input and a boost input, whereby said first voltage level is related to a ground potential, said second voltage level is related to a battery potential and said third voltage level is related to a boost potential.

3. A multilevel class-D amplifier as recited in claim 1 wherein said first logic level is one of 0 and 1 and wherein said second logic level is the other one of 0 and 1.

4. A multilevel class-D amplifier as recited in claim 1 wherein said non-sinusoidal waveforms comprise triangle waves.

5. A multilevel class-D amplifier as recited in claim 1 wherein said first generator output and said second generator output are at about the same frequency and phase.

6. A multilevel class-D amplifier as recited in claim 1 wherein said non-sinusoidal waveforms contain only odd harmonics.

7. A multilevel class-D amplifier as recited in claim 1 wherein said first generator output and said second generator output are vertically adjacent.

8. A multilevel class-D amplifier as recited in claim 1 wherein said first generator output and said second generator output vertically overlap.

9. A multilevel class-D amplifier as recited in claim 1 wherein said first generator output and said second generator output are vertically separated.

10. A multilevel class-D amplifier as recited in claim 1 wherein said first generator output has a first amplitude and said second generator output has a second amplitude.

11. A multilevel class-D amplifier as recited in claim 10 wherein said first amplitude and said second amplitude have a common factor.

12. A multilevel class-D amplifier as recited in claim 11 wherein said common factor is 2.

13. A multilevel class-D amplifier as recited in claim 1 further comprising first feedback circuitry coupling said output of said first power stage to said first input and to said second input of said first power stage and second feedback circuitry coupling said output of said second power stage to said first input and to said second input of said second power stage.

14. A method for operating a multilevel class-D differential amplifier including a first power stage and second power stage comprising:
    (a) applying a pair of non-sinusoidal waveforms that are vertically offset with respect to each other to inputs of said first power stage and said second power stage;
    (a) operating in an idle mode wherein an output of said first power stage varies between a first voltage level, which serves as a reference, and second voltage level with respect to said reference, wherein an output of said second power stage varies between said first voltage level and said second voltage level, and wherein a differential signal between said outputs of said power stages is about zero;
    (b) operating in a PWM mode wherein said output of said first power stage varies between said first voltage level and said second voltage level, wherein said output of said second power stage varies between said first voltage level and said second voltage level, and wherein said differential signal between said outputs of said power stages is pulse width modulated; and
    (c) operating in a Multi-Level mode wherein said output of said first power stage varies between said second voltage level and a third voltage level with respect to said reference, where said third voltage level is of greater magnitude than said second voltage level, wherein said output of said second power stage is fixed as said first voltage level, and wherein said differential signal between said outputs of said power stages is pulse width modulated.

15. A method for operating a multilevel class-D differential amplifier including a first power stage and a second power stage as recited in claim 14 further comprising:
    (d) operating in a CLIPPING mode wherein said output of said first power stage is fixed at said third voltage level and said output of said second power stage is fixed at said first voltage level.

16. A multilevel class-D amplifier comprising:
    a first power stage having a first input, a second input, an output and at least three power inputs, said first power stage including logic such that when said first input is at a first logic level said output is at a first voltage level, when said first input is at a second logic level and said second input is at said first logic level said output is at a second voltage level, and when both said first input and said second input are at said second logic level said output is at a third voltage level;
    a second power stage having a first input, a second input, an output and at least three power inputs, said second power stage including logic such that when said first input is at a first logic level said output is at a first voltage level, when said first input is at a second logic level and said second input is at said first logic level said output is at a second voltage level, and when both said first input and said second input are at said second logic level said output is at a third voltage level;
    a first generator output coupled to said first input of said first power stage and said first input of said second power stage; and
    a second generator output coupled to said second input of said first power stage and said second input of said second power stage;
    wherein first generator output and said second generator output comprise non-sinusoidal waveforms containing only odd harmonics.

17. A multilevel class-D amplifier as recited in claim 16 wherein said first generator output and said second generator output are at about the same frequency and phase.

18. A multilevel class-D amplifier as recited in claim 16 wherein said first generator output has a first amplitude and said second generator output has a second amplitude.

19. A multilevel class-D amplifier as recited in claim 16 wherein said first generator output said second generator output are vertically offset.

20. A multilevel class-D amplifier as recited in claim 16 wherein said first generator output and said second generator output are developed by one or more generators.

* * * * *